United States Patent
Kawata et al.

(10) Patent No.: US 6,211,277 B1
(45) Date of Patent: Apr. 3, 2001

(54) ENCAPSULATING MATERIAL AND LOC STRUCTURE SEMICONDUCTOR DEVICE USING THE SAME

(75) Inventors: Tatsuo Kawata; Hiroki Sashima; Takaki Kashihara; Masanobu Fujii, all of Shimodate; Naoki Nara, Mito; Terumi Tsukahara; Hiroyuki Sakai, both of Shimodate, all of (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/165,202

(22) Filed: Oct. 2, 1998

(30) Foreign Application Priority Data

Oct. 3, 1997 (JP) ..................................................... 9-270678

(51) Int. Cl.$^7$ ..................................................... C08K 3/00
(52) U.S. Cl. ........................................... 524/492; 524/493
(58) Field of Search ..................................... 524/492, 493

(56) References Cited

U.S. PATENT DOCUMENTS 5,759,875 * 6/1998 Ahmad ................................. 438/127

FOREIGN PATENT DOCUMENTS 8-255854 * 10/1996 (JP) .

* cited by examiner

Primary Examiner—Edward J. Cain
(74) Attorney, Agent, or Firm—Antonelli, Terry, Stout & Kraus, LLP

(57) ABSTRACT

An LOC structure semiconductor device having a good solder heat resistance without electrical characteristic failures due to damages to the passivation film and the diffusion layer thereunder attributing to the filler can be obtained by encapsulating an LOC structure semiconductor chip with an encapsulating material comprising an epoxy resin, a curing agent, a curing promoter, and an inorganic filler, the filler having a smaller particle size than the distance between a inner lead and a semiconductor chip and being in an amount of 80 to 95% by weight based on the total weight of the encapsulating material.

13 Claims, 1 Drawing Sheet

ENCAPSULATING MATERIAL AND LOC STRUCTURE SEMICONDUCTOR DEVICE USING THE SAME

BACKGROUND OF THE INVENTION

The present invention relates to an encapsulating material for an LOC structure semiconductor device and an LOC structure semiconductor device using the same.

With increasing integration rate of semiconductor chips in IC, LSI, etc., there are now trends toward larger chip sizes, and smaller and thinner semiconductor devices. At the same time, the semiconductor devices themselves, when they are to be mounted on substrates, are more often exposed to high temperatures such as 200° C. or higher for a short time, where the moisture contained in the encapsulating material is vaporized and the generated vapor pressure exerts the boundary between the encapsulating material and inserts such as chips, lead frames, etc. as a peeling stress, resulting in swelling or cracking of particularly thin semiconductor devices.

To prevent such swelling or cracking due to the peeling stress, attempts have been so far made to lower the viscosity (molecular weight) of epoxy resin and curing agents or improve the adhesiveness between the encapsulating material and the inserts or spheradize inorganic fillers, thereby increasing a packing density and decreasing a water absorption percentage, but have been found not satisfactory yet.

With the trends toward smaller semiconductor device and improving the solder heat resistance, the semiconductor device structure is now changing from the conventional structure of mounting a semiconductor chip onto a lead to the LOC (lead-on-chip) structure of mounting an inner lead onto a semiconductor chip.

However, the conventional procedure has such problems that coarser particles of filler in the encapsulating material fill a clearance (distance) between a semiconductor chip and an inner lead, and molding pressure, molding contraction and stresses such as thermal stress, etc. generated when the semiconductor device is to be mounted onto a substrate exert the semiconductor chip, resulting in damages to the passivation film or even to a diffusion layer in the worst case as a cause of electrical characteristics failures.

SUMMARY OF THE INVENTION

The present invention has been established in these current situations and an object of the present invention is to provide an encapsulating material having a distinguished solder heat resistance and free from electrical characteristics failure due to damages to a passivation film and a diffusion layer thereunder attributable to the filler and also to provide an LOC structure semiconductor device.

The present invention provides an encapsulating material for an LOC structure semiconductor device, which comprises an epoxy resin, a curing agent for the epoxy resin, a curing accelerator, and an inorganic filler, said filler having a particle size of 90% or less of a distance between an inner lead and a semiconductor chip in the LOC structure semiconductor in the case of the distance being 70 μm or more, or having a particle size of 95% or less of the distance between an inner lead and a semiconductor chip in the case of the distance being less than 70 μm, and the amount of said filler being 80 to 95% by weight, based on the total weight of the encapsulating material.

The present invention also provides a semiconductor device and an inner lead provided on the semiconductor chip and fixed thereon by an LOC tape, the entirety being encapsulated with said encapsulating material.

DETAILED DESCRIPTION OF THE INVENTION

The present encapsulating material for an LOC structure semiconductor device comprises an epoxy resin, a curing agent for the epoxy resin, a curing accelerator, and an inorganic filler, said filler having a particle size of 90% or less, preferably 80% or less, more preferably 75% or less of a distance between an inner lead and a semiconductor chip in the LOC structure semiconductor in the case of the distance being 70 μm or more, or having a particle size of 95% or less, preferably 90% or less, more preferably 85% or less of the distance between an inner lead and a semiconductor chip in the case of the distance being less than 70 μm, and the amount of said filler being 80 to 95% by weight, based on the total weight of the encapsulating material.

Figure 1:
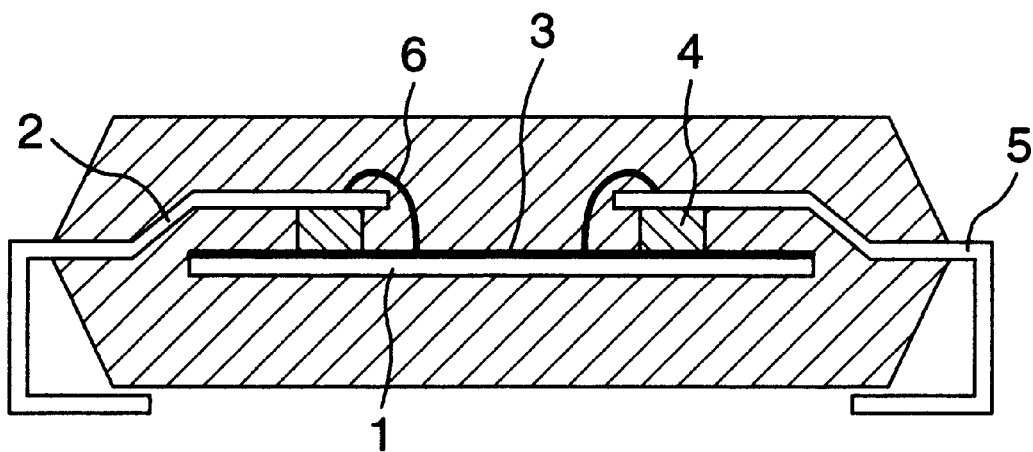
FIG. 1 is a cross-sectional view of an LOC structure semiconductor device obtained according to Example 1.

The present resin-sealed LOC structure semiconductor device comprises, as shown, for example, in FIG. 1, a semiconductor chip 1, an inner lead 2 provided thereon, an adhesive called LOC tape 4 for fixing the inner lead 2 to the semiconductor chip 1, a gold wire 6 for communicating the inner lead 2 with the semiconductor chip 1, and a passivation film 3 for covering the semiconductor chip 6, the entirety except a lead frame 5 being packaged by said encapsulating material.

When an encapsulating material containing coarse particles of inorganic filler is used, as in the case of prior art, such coarse particles fill a clearance corresponding to the thickness of the LOC tape, various stresses such as thermal stress, etc. due to molding pressure, molding contraction, etc. exert the semiconductor chip, resulting in damages to the passivation film and electrical characteristics failures. The present encapsulating material can solve such problems and also can attain such an unexpected effect as a distinguished solder heat resistance.

Epoxy resin for use in the present invention includes o-cresol novolak epoxy resins, biphenyl epoxy resins, dicyclo epoxy resins, brominated epoxy resins, etc. which can be used alone or in combination thereof. Above all, biphenyl epoxy resins are preferable from the viewpoint of good adhesiveness with the insert.

Curing agent for the epoxy resin for use in the present invention includes phenol-novolak resins, aralkylphenol resins, terpene resins, etc., which can be used alone or in combination thereof. Above all, the aralkyl phenol resin curing agent is particularly preferable from the viewpoint of adhesiveness with the insert.

Curing accelerator for use in the present invention is not particularly limited and includes tetraphenylphosphonium-tetraphenyl borate, triphenylphosphine, adduct of triphenylphophine and benzoquinone, 1,8-diazabicyclo(5,4,0)-undecene-7, 2-pheyl-4-methylimidazole, triphenylphosphonium-triphenylborane, etc., which an be used alone or in combination thereof. Above all, the adduct of triphenylphosphine and benzoquinone is preferable from the viewpoint of moldabilities such as voids, packing density, etc.

The present encapsulating material can further contain any other ordinary additives. For example, the present encapsulating material has no special limitation to use of a coupling agent, and silane coupling agents can be used alone or in combination thereof. Above all, a combination of epoxysilane, alkylsilane and mercaptosilane is preferable.

The present encapsulating material also has no special limitation to use of a mold-releasing agent, and higher fatty acids such as carnauba wax, etc., and polyethylene-based wax can be used alone or in combination thereof.

Particle size and shape of the inorganic filler must be selected in view of clearance (distance) between the semiconductor chip and the inner lead, as mentioned before. For example, in the case of using a 100 $\mu$m-thick LOC tape in the adhesion of the inner lead to the chip, it is preferable to use a filler having a particle size of 75 $\mu$m or less, and in the case of using a 50 $\mu$m-thick LOC tape it is preferable to use a filler having a particle size of less than 40 $\mu$m. The amount of the filler is 80 to 95% by weight, based on the total weight of the encapsulating material. Below 80% by weight the solder heat resistance will be poor, whereas above 95% by weight the flowability will be much lowered and the molding cannot be carried out any more.

It is desirable that at least 50% of filler shape is spherical, and the filler can be made of fused silica, crystalline silica, alumina, etc. alone or in combination thereof. Above all, fused silica alone is preferable.

Other additives for use in the present invention include a colorant (carbon black, etc.), a flame retardant (antimony trioxide, etc.), a modifying agent (silicone, silicone rubber, etc.), and an ion trapper (hydrofacite), antimony-bismuth, etc.)

The present encapsulating material comprising the foregoing components can give no more electrical characteristics failures due to damages to the passivation film and the diffusion layer thereunder attributing to the filler and also can improve the solder heat resistance.

The present encapsulating material can be prepared by any procedure without any particular limitation, that is, by kneading through the ordinary roll kneading procedure, kneader mixing procedure, etc. followed by cooling and pulverization. The resulting powders can be used directly or after tabletting.

The present invention will be described in detail below, referring to Examples, which are not limitative of the present invention.

EXAMPLES 1 TO 6 AND COMPARATIVE EXAMPLES 1 to 9

At first, raw materials shown in Tables 1 and 2 were premixed (dry blended) and then kneaded by a biaxial roll (roll surface temperature: about 80° C.) for 10 minutes, followed by cooling and pulverization, whereby the encapsulating materials were prepared.

The thus obtained encapsulating materials were molded through a transfer molding machine provided with a 42-alloy lead frame fixed with a semiconductor chip having a chip size of 5.9 mm×10.8 mm under such molding conditions as a molding temperature of 180° C., a molding pressure of 100 kgf/cm$^2$, and a curing time of 90 seconds, followed by post curing of 180° C./5 hr.

Electrical characteristics could not be directly carried out, and thus damages on the passivation film were inspected. Semiconductor devices for inspection of damages on the passivation film were LOC structure semiconductor devices of 26-pin SOJ and also of 26-pin TSOP.

The chip had a passivation film (thickness: about 5 $\mu$m), and the LOC tape having a thickness of about 100 $\mu$m was used in the case of 26-pin SOJ and that with a thickness of about 50 $\mu$m was used in the case of 26-pin TSOP.

Figure 2:
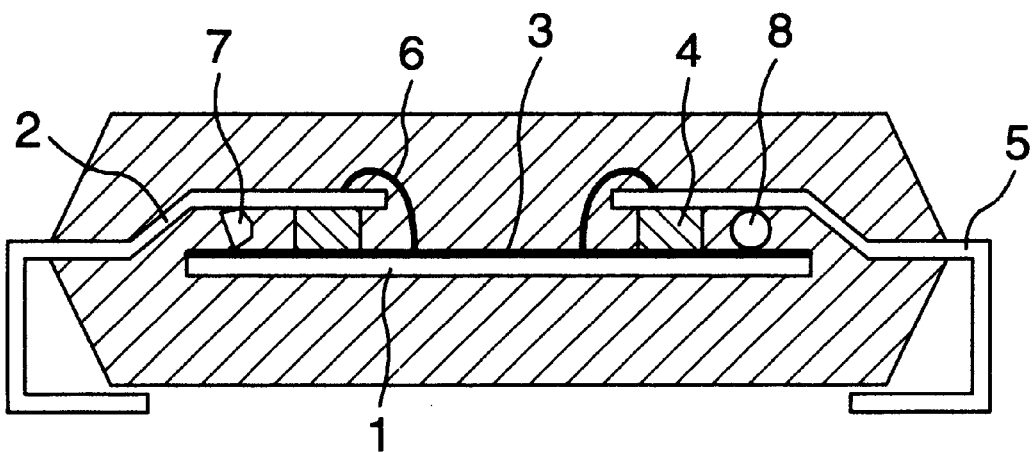
FIG. 2 is a cross-sectional view of an LOC structure semiconductor device obtained according to Comparative Example 1.

FIG. 1 is the cross-sectional view of the semiconductor device according to Example 1 and FIG. 2 is a cross-sectional view of the semiconductor device according to Comparative Example 1. In FIG. 2, a large angular filler 7 and a large spherical filler 8 are present between an inner lead 2 and a semiconductor chip 1 and act to damage the passivation film 3.

The resulting resin-sealed semiconductor devices (LOC structure) were tested by polishing the encapsulating material layer on the chip, dipping the devices with a slightly remaining encapsulating material layer into hot concentrated sulfuric acid, and then inspecting damages on the passivation film by a stereomicroscope and an electron microscope.

The semiconductor devices tested for solder heat resistance were resin-sealed semiconductor devices of 80-pin QFP (outer dimension: 20 mm×14 mm×2.0 mm) and the lead frame was made of 42-alloy material (without being processed) and had a chip having a size of 8 mm×10 mm.

The resin-sealed semiconductor devices so obtained were tested for solder heat resistance in the following manner. After baking at 125° C. for 24 hours, the semiconductor devices were subjected to moisture absorption at 85° C. and 85% RH for 48 hours, followed by heat treatment at 240° C. for 10 seconds. Crack generation rate of the thus treated semiconductor devices was determined. The test results are shown in Tables 3-1 to 3-4 as summary.

TABLE 1

| Item | Ex. 1 | Ex. 2 | Ex. 3 & 5 | Ex. 4 & 6 |
|---|---|---|---|---|
| Biphenyl epoxy resin | 85.0 | 85.0 | 85.0 | 85.0 |
| Brominated epoxy resin | 15.0 | 15.0 | 15.0 | 15.0 |
| Aralkylphenyl resin | 84.5 | 84.5 | 84.5 | 84.5 |
| Adduct of triphenylphosphine and benzoquinone | 3.5 | 3.5 | 3.5 | 3.5 |
| Epoxysilane | 7.0 | 7.0 | 7.0 | 7.0 |
| Alkylsilane | 4.7 | 4.7 | 4.7 | 4.7 |
| Mercaptosilane | 0.1 | 0.1 | 0.1 | 0.1 |
| Carnauba wax | 1.0 | 1.0 | 1.0 | 1.0 |
| Polyethylene wax | 1.0 | 1.0 | 1.0 | 1.0 |
| Carbon black | 3.0 | 3.0 | 3.0 | 3.0 |
| Antimony trioxide | 10.0 | 10.0 | 10.0 | 10.0 |
| Fused silica (spherical 75 $\mu$m under) | 783 | 783 | — | — |
| Fused silica (broken 75 $\mu$m under) | 335 | — | 335 | — |
| Fused silica (spherical 45 $\mu$m under) | — | — | 783 | 783 |
| Fused silica (broken 45 $\mu$m under) | — | 335 | — | 335 |
| Amount of fused silica (wt. %) | 84 | 84 | 84 | 84 |

Note) Unit: g
Biphenylepoxy resin: made by Yuka-Shell Epoxy K.K., Japan
Brominated epoxy resin: made by Tohto Kasei Co., Ltd., Japan
Aralkylphenol resin: made by Mitsui Toatsu Chemicals Inc., Japan
Adduct of triphenylphosine and benzoquinone: made by Hokko Kagaku K.K., Japan

TABLE 2

| Item | Comp. Ex.1 | Comp. Ex.2 | Comp. Ex.3 | Comp. Ex.4 | Comp. Ex.5 | Comp. Ex.6 | Comp. Ex.7 | Comp. Ex.8 | Comp. Ex.9 |
|---|---|---|---|---|---|---|---|---|---|
| Biphenyl epoxy resin | 85.0 | 85.0 | 85.0 | 85.0 | 85.0 | 85.0 | 85.0 | 85.0 | 85.0 |
| Brominated epoxy resin | 15.0 | 15.0 | 15.0 | 15.0 | 15.0 | 15.0 | 15.0 | 15.0 | 15.0 |
| Aralkylphenol resin | 84.5 | 84.5 | 84.5 | 84.5 | 84.5 | 84.5 | 84.5 | 84.5 | 84.5 |
| Adduct of triphenylphosphine and benzoquinone | 3.5 | 3.5 | 3.5 | 3.5 | 3.5 | 3.5 | 3.5 | 3.5 | 3.5 |
| Epoxysilane | 6.4 | 6.4 | 6.4 | 6.4 | 6.4 | | | | |
| Alkylsilane | 6.4 | 6.4 | 6.4 | 6.4 | 4.3 | 4.3 | 4.3 | 4.3 | 4.3 |
| Mercaptosilane | 4.3 | 4.3 | 4.3 | 4.3 | 0.1 | 0.1 | 0.1 | 0.1 | 0.1 |
| Carnauba wax | 0.1 | 0.1 | 0.1 | 0.1 | 1.0 | 1.0 | 1.0 | 1.0 | 1.0 |
| Polyethylene wax | 1.0 | 1.0 | 1.0 | 1.0 | 1.0 | 1.0 | 1.0 | 1.0 | 1.0 |
| Carbon black | 1.0 | 1.0 | 1.0 | 1.0 | 3.0 | 3.0 | 3.0 | 3.0 | 3.0 |
| Antimony trioxide | 3.0 | 3.0 | 3.0 | 3.0 | 10.0 | 10.0 | 10.0 | 10.0 | 10.0 |
| Fused silica (spherical normally 105–150 $\mu$m under) | 10.0 | 10.0 | 10.0 | 10.0 | 335 | — | — | — | — |
| | 783 | 783 | 783 | — | — | 500 | 500 | — | — |
| Fused silica (broken normally 105–150 $\mu$m under) | — | 214 | — | 214 | — | | | | |
| | 335 | — | — | 335 | 335 | — | — | — | — |
| | — | — | 214 | — | 214 | | | | |
| Fused silica (spherical 75 $\mu$m under) | — | — | — | 783 | — | 500 | 500 | — | — |
| Fused silica (broken 75 $\mu$m under) | — | 335 | — | — | — | 214 | — | 214 | — |
| Fused silica (spherical 45 $\mu$m under) | — | — | — | — | 783 | — | — | 500 | 500 |
| Fused silica (broken 45 $\mu$m under) | — | — | 335 | — | — | — | 214 | — | 214 |
| Fused silica (wt. %) | 84 | 84 | 84 | 84 | 84 | 77 | 77 | 77 | 77 |

TABLE 3-1

| Item | PKG | LOC tape thickness | Unit | Ex. 1 | Ex. 2 | Ex. 3 | Ex. 4 |
|---|---|---|---|---|---|---|---|
| Damages on passivation film | 26pSOJ | Ca. 100 $\mu$m | Poor PKG/ Total PKG | 0/10 | 0/10 | 0/10 | 0/10 |
| Solder heat resistance | 80pQFP | None | | 0/10 | 0/10 | 0/10 | 0/10 |

TABLE 3-2

| Item | PKG | LOC tape thickness | Unit | Ex. 5 | Ex. 6 |
|---|---|---|---|---|---|
| Damages on passivation film | 26pTSOP | Ca. 50 $\mu$m | Poor PKG/ Total PKG | 3/10 | 0/10 |
| Solder heat resistance | 80pGFP | None | | 0/10 | 0/10 |

Note)
PKG (packaging) with observed passivation film damages was evaluated as "poor".
Solder heat resistance with generated PKG cracks was evaluated as "poor".

TABLE 3-3

| Item | PKG | LOC tape thickness | Unit | Comp. Ex.1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 |
|---|---|---|---|---|---|---|---|---|---|---|---|---|
| Damages on passivation film | 26pSOJ | Ca. 100 μm | Poor PXG/ Total PKG | 10/10 | 10/10 | 10/10 | 3/10 | 3/10 | 0/10 | 0/10 | 0/10 | 0/10 |
| Solder heat resistance | 80pQFP | None | | 0/10 | 0/10 | 0/10 | 0/10 | 10/10 | 10/10 | 10/10 | 10/10 | 10/10 |

TABLE 3-4

| Item | PKG | LOC tape thickness | Unit | Comp. Ex.1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 |
|---|---|---|---|---|---|---|---|---|---|---|---|---|
| Damages on passivation film | 26pTSOP | Ca. 50 μm | Poor PXG/ Total PKG | 10/10 | 10/10 | 10/10 | 10/10 | 0/10 | 8/10 | 8/10 | 2/10 | 0/10 |
| Solder heat resistance | 80pQFP | None | | 0/10 | 0/10 | 0/10 | 0/10 | 0/10 | 10/10 | 10/10 | 10/10 | 10/10 |

As is evident from the results shown in Tables 3-1 to 3-4, LOC structure semiconductor devices with a good heat resistance and good electrical characteristics can be obtained by using a filler having a particle size smaller than the distance between the inner lead and the semiconductor chip and making the amount of the filler 80 to 95% by weight based on the total weight of the encapsulating material.

According to the present invention the electrical characteristics failures due to damages to the passivation film and the diffusion layer thereunder attributing to the filler can be eliminated and the solder heat resistance can be improved.

What is claimed is:

1. An encapsulating material for a lead-on-chip structure semiconductor, said encapsulating material comprising an epoxy resin, a curing agent for the epoxy resin, a curing accelerator, and an inorganic filler, said filler having a particle size of 90% or less of a distance between an inner lead and a semiconductor chip in the lead-on-chip structure semiconductor in the case of the distance being 70 μm or more, or having a particle size of 95% or less of the distance between an inner lead and a semiconductor chip in the case of the distance being less than 70 μm, and the amount of said filler being 80 to 95% by weight based on the total weight of the encapsulating material.

2. An encapsulating material according to claim 1, wherein the inorganic filler has a spherical shape in an amount of 50% by weight or more based on the total weight of the filler.

3. An encapsulating material according to claim 1, wherein the epoxy resin is a biphenyl epoxy resin, and the curing agent is an aralkyl phenol resin.

4. A process for using the encapsulating material of claim 1 for encapsulating a lead-on-chip structure semiconductor.

5. A semiconductor device comprising a semi- conductor chip, an inner lead fixed on the semiconductor chip using an adhesive tape, and an encapsulating material of claim 1 packaging the semiconductor chip and the inner lead.

6. An encapsulating material according to claim 1, wherein said filler has a particle size of 80% or less of the distance between the inner lead and the semiconductor chip in the case of the distance being 70 μm or more.

7. An encapsulating material according to claim 1, wherein said filler has a particle size of 75% or less of the distance between the inner lead and the semiconductor chip in the case of the distance being 70 μm or more.

8. An encapsulating material according to claim 1, wherein said filler has a particle size of 90% or less of the distance between the inner lead and the semiconductor chip in the case of the distance being less than 70 μm.

9. An encapsulating material according to claim 1, wherein said filler has a particle size of 85% or less of the distance between the inner lead and the semiconductor chip in the case of the distance being less than 70 μm.

10. An encapsulating material according to claim 1, wherein said filler is made of at least one material selected from the group consisting of fused silica, crystalline silica and alumina.

11. An encapsulating material according to claim 1, wherein the filler is made of fused silica.

12. An encapsulating material according to claim 1, wherein the curing accelerator is at least one member selected from the group consisting of tetraphenylphosphonium-tetraphenyl borate, triphenylphosphine, adduct of triphenylphosphine and benzoquinone, 1,8-diazobicyclo(5,4,0)-undecene- 7, 2-phenyl-4-methylimidazole, and triphenylphosphonium-triphenylborane.

13. An encapsulating material for a lead-on-chip structure semiconductor, said encapsulating material comprising an epoxy resin, a curing agent for the epoxy resin, a curing accelerator, and an inorganic filler, said filler having a particle size of 90% or less of a distance between an inner lead and a semiconductor chip in the lead-on-chip structure semiconductor in the case of the distance being 70 μm or more, or having a particle size of 95% or less of the distance between an inner lead and a semiconductor chip in the case of the distance being less than 70 μm, and the amount of said filler being 80 to 95% by weight based on the total weight of the encapsulated material, wherein the curing accelerator is an adduct of triphenylphosphine and benzoquinone.

* * * * *